(12) United States Patent
Hsu et al.

(10) Patent No.: US 11,450,596 B2
(45) Date of Patent: Sep. 20, 2022

(54) LEAD FRAME, PACKAGE STRUCTURE AND METHOD FOR MANUFACTURING THE SAME

(71) Applicant: Advanced Semiconductor Engineering, Inc., Kaohsiung (TW)

(72) Inventors: Yi-Cheng Hsu, Kaohsiung (TW);
Chih-Hung Hsu, Kaohsiung (TW);
Mei-Lin Hsieh, Kaohsiung (TW);
Yuan-Chun Chen, Kaohsiung (TW);
Yu-Shun Hsieh, Kaohsiung (TW);
Ko-Pu Wu, Kaohsiung (TW); Chin Li Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 41 days.

(21) Appl. No.: 16/693,193

(22) Filed: Nov. 22, 2019

(65) Prior Publication Data

US 2021/0159155 A1 May 27, 2021

(51) Int. Cl.
*H01L 23/498* (2006.01)
*H01L 23/00* (2006.01)
(Continued)

(52) U.S. Cl.
CPC .... *H01L 23/49833* (2013.01); *H01L 21/4832* (2013.01); *H01L 21/563* (2013.01);
(Continued)

(58) Field of Classification Search
CPC . H01L 23/49833; H01L 21/563; H01L 24/45;
H01L 23/49861; H01L 21/4832; H01L 23/49811; H01L 24/05; H01L 24/03; H01L 23/495–49596; H01L 33/62; H01L 23/49503–49513; H01L 2224/40237; H01L 2224/40257; H01L 2224/48237; H01L 2224/48257; H01L 21/4846–4867; H01L 23/498–49866;
(Continued)

(56) References Cited

U.S. PATENT DOCUMENTS

| 8,089,159 | B1 * | 1/2012 | Park | H01L 24/81 |
| | | | | 257/773 |
| 8,184,453 | B1 * | 5/2012 | Kim | H01L 23/49541 |
| | | | | 361/813 |

(Continued)

FOREIGN PATENT DOCUMENTS

JP 6573157 B2 9/2019

OTHER PUBLICATIONS

U.S. Appl. No. 16/442,286, filed Jun. 14, 2019, Chen et al.

*Primary Examiner* — Cuong B Nguyen
(74) *Attorney, Agent, or Firm* — Foley & Lardner LLP

(57) ABSTRACT

A lead frame includes a die paddle, a plurality of leads, at least one connector and a bonding layer. The leads surround the die paddle. Each of the leads includes an inner lead portion adjacent to and spaced apart from the die paddle and an outer lead portion opposite to the inner lead portion. The connector is connected to the die paddle and the inner lead portions of the leads. The bonding layer is disposed on a lower surface of the die paddle and a lower surface of each of the outer lead portions.

10 Claims, 28 Drawing Sheets

(51) Int. Cl.
*H01L 21/48* (2006.01)
*H01L 21/56* (2006.01)
(52) U.S. Cl.
CPC .. *H01L 23/49811* (2013.01); *H01L 23/49861* (2013.01); *H01L 24/03* (2013.01); *H01L 24/05* (2013.01); *H01L 24/45* (2013.01)
(58) Field of Classification Search
CPC . H01L 23/045–051; H01L 23/055–057; H01L 23/043–051; H01L 23/3128; H01L 21/4828; H01L 21/561; H01L 23/3107; H01L 23/3135; H01L 23/49582; H01L 23/49548; H01L 23/49541; H01L 21/4821; H01L 23/4952; H01L 23/49575; H01L 2224/48091; H01L 2224/48247; H01L 2224/97; H01L 2924/181
See application file for complete search history.

(56) References Cited

U.S. PATENT DOCUMENTS

| | | | |
|---|---|---|---|
| 8,866,278 B1* | 10/2014 | Bae | H01L 23/49548 257/676 |
| 10,079,198 B1* | 9/2018 | Cadag | H01L 23/49861 |
| 2015/0348934 A1* | 12/2015 | Qin | H01L 23/52 438/113 |

* cited by examiner

LEAD FRAME, PACKAGE STRUCTURE AND METHOD FOR MANUFACTURING THE SAME

BACKGROUND

1. Field of the Disclosure

The present disclosure relates to a lead frame, a package structure and a manufacturing method, and to a lead frame including a plurality of leads surrounding a die paddle, a package structure including the lead frame and a method for manufacturing the lead frame and the package structure.

2. Description of the Related Art

As for semiconductor packages such as quad flat non-leaded package (QFN), a length of each of leads is generally constrained to less than or equal to 2 mm and cannot be readily further lengthened. This is due to the structural strength of the lead becomes weak when the length of the lead is more than 2 mm. However, lengthening the length of the lead may be specified when a smaller semiconductor die is attached to the die paddle, to ensure the leads may be still near the smaller semiconductor die and prevent the bonding wire from being longer than its optimum length.

In addition, a support kit is included to support bonding ends of the leads to prevent the leads from shaking or deforming during a wire bonding process. However, a manufacturing error may cause dimension errors of the support kit and the leads, thereby generating a gap between the support kit and the bonding ends of the leads. The gap may cause the leads from shaking during wire bonding process.

SUMMARY

In some embodiments, a lead frame includes a die paddle, a plurality of leads, at least one connector and a bonding layer. The leads surround the die paddle. Each of the leads includes an inner lead portion adjacent to and spaced apart from the die paddle and an outer lead portion opposite to the inner lead portion. The connector is connected to the die paddle and the inner lead portions of the leads. The bonding layer is disposed on a lower surface of the die paddle and a lower surface of each of the outer lead portions.

In some embodiments, a package structure includes a die paddle, a plurality of leads and an encapsulant. The leads surround the die paddle. Each of the leads includes an inner lead portion adjacent to and spaced apart from the die paddle and an outer lead portion opposite to the inner lead portion. The encapsulant covers the die paddle and the leads, and defines at least one opening on a bottom surface thereof to expose a portion of the die paddle and a portion of each of the inner lead portions.

In some embodiments, a method for manufacturing a package structure includes: (a) providing a metal plate; (b) forming a bonding layer to cover a portion of the metal plate and expose a portion of the metal plate; (c) etching the exposed portion of the metal plate to form a lead frame, wherein the lead frame includes a die paddle, a plurality of leads surrounding the die paddle, at least one connector and the bonding layer, each of the leads includes an inner lead portion adjacent to and spaced apart from the die paddle and an outer lead portion opposite to the inner lead portion, the connector is connected to the die paddle and the inner lead portions of the leads, and the bonding layer is formed on a lower surface of the die paddle and a lower surface of each of the outer lead portions; (d) disposing a semiconductor die on the die paddle, and electrically connecting the semiconductor die and the inner lead portions through a plurality of bonding wires; (e) forming an encapsulant to cover the semiconductor die, the die paddle, the bonding wires, the leads and the connector, and exposing a lower surface of the connector; (f) removing the connector to form at least one opening on a bottom surface of the encapsulant and to expose a portion of the die paddle and a portion of each of the inner lead portions; and (g) forming a coating in the least one opening to cover the exposed portion of the die paddle and the exposed portion of each of the inner lead portions.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
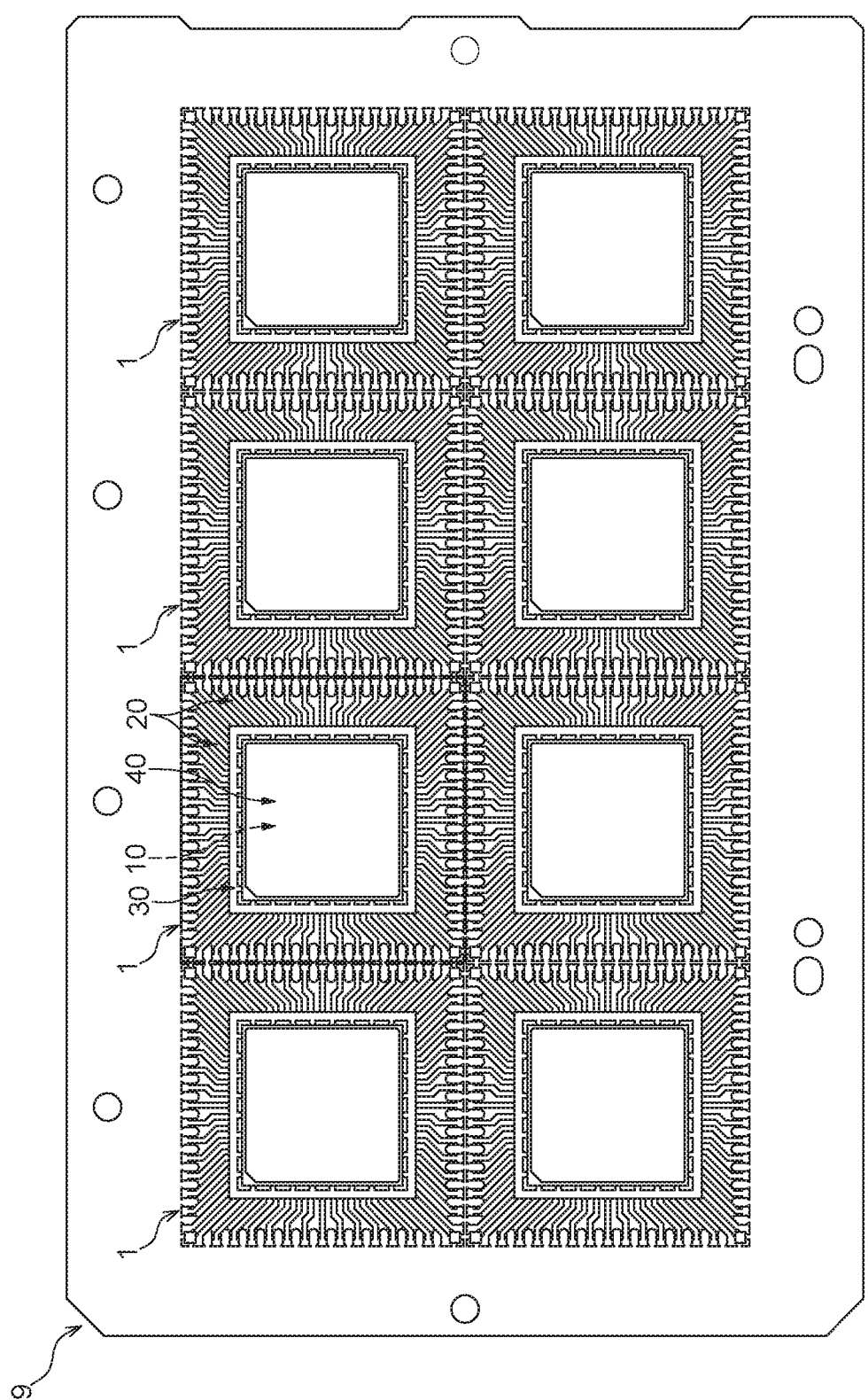
FIG. 1 illustrates a bottom view of a lead frame according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
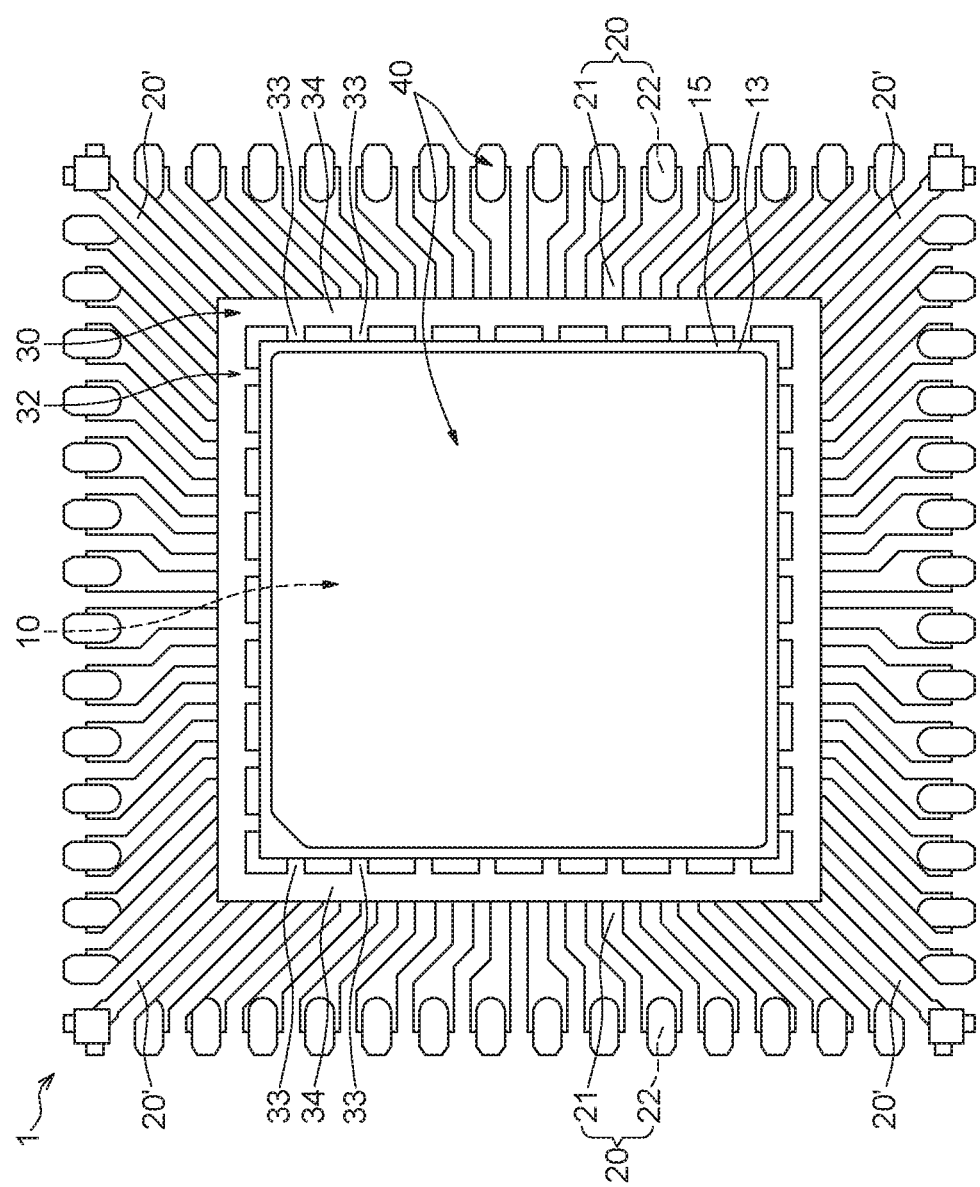
FIG. 2 illustrates a partially enlarged view of FIG. 1.
Figure 3:
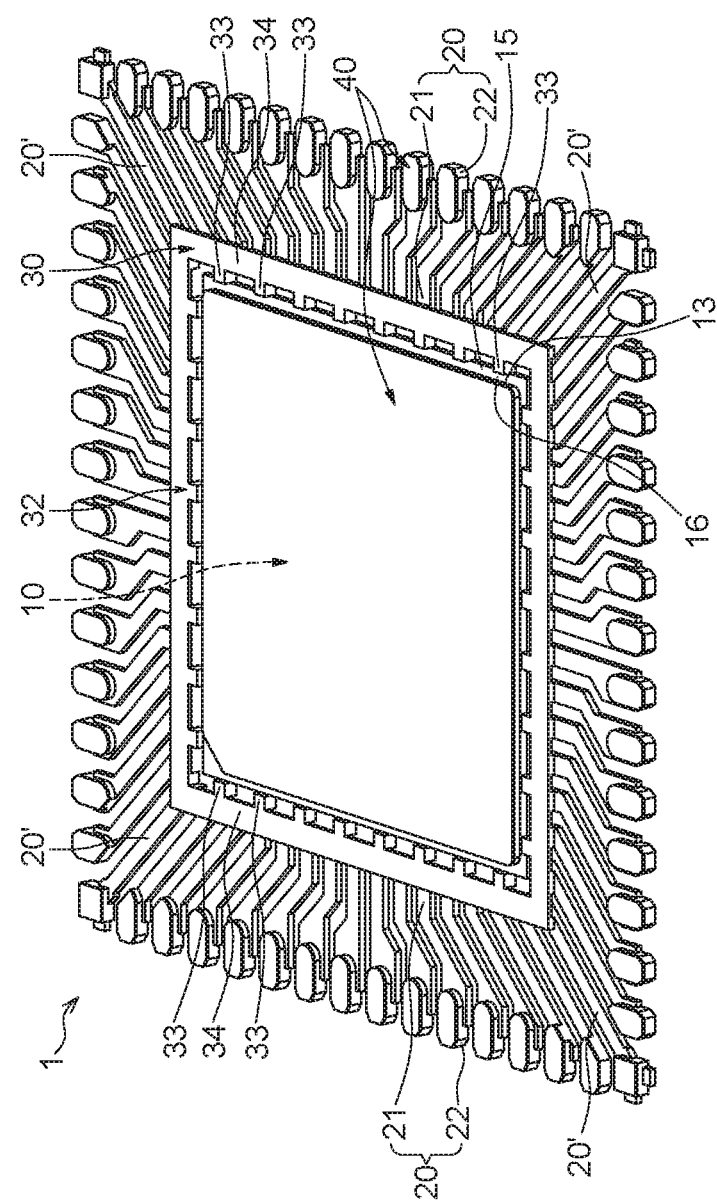
FIG. 3 illustrates a perspective view of FIG. 2.
Figure 4:
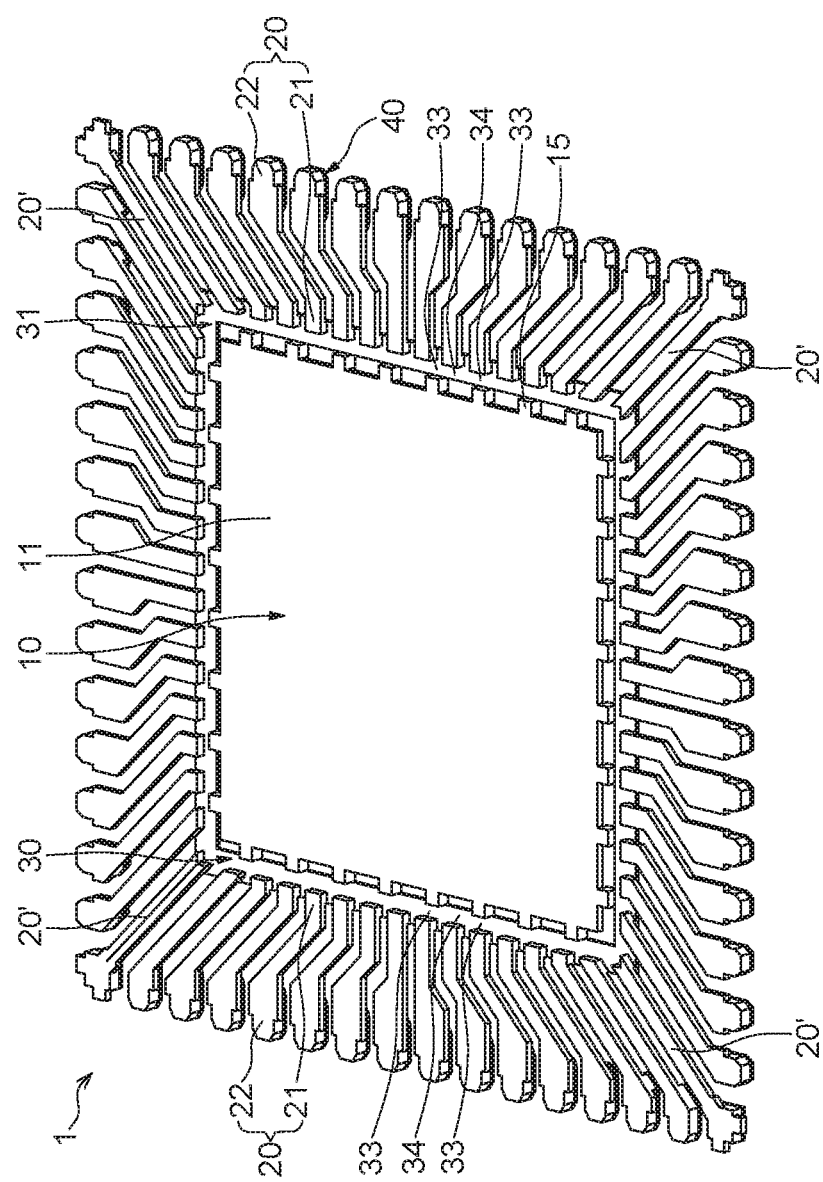
FIG. 4 illustrates a top perspective view of FIG. 3.
Figure 5:
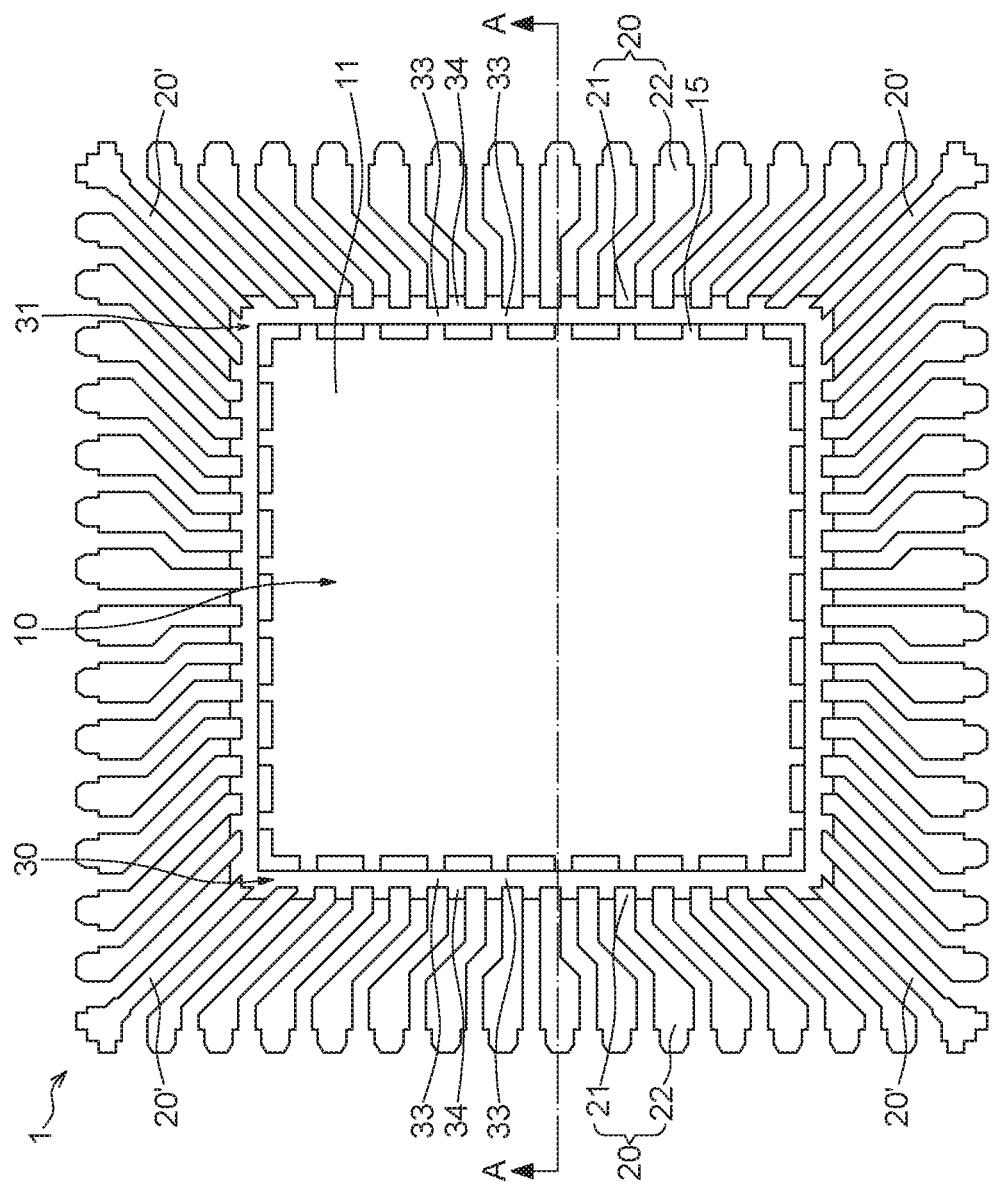
FIG. 5 illustrates a top view of FIG. 4.

FIG. 1 illustrates a bottom view of a lead frame 9 according to some embodiments of the present disclosure. FIG. 2 illustrates a partially enlarged view of FIG. 1. FIG. 3 illustrates a perspective view of FIG. 2. FIG. 4 illustrates a top perspective view of FIG. 3. FIG. 5 illustrates a top view of FIG. 4. Referring to FIG. 1, the lead frame 9 may include a plurality of lead frame units 1 arranged in an array. In some embodiments, the lead frame 9 may be a pre-plated lead frame (PPF). Referring to FIGS. 2-5, the lead frame unit 1 includes a die paddle 10, a plurality of leads 20, at least four corner leads 20', at least one connector 30 and a bonding layer 40. In some embodiments, the lead frame unit 1 may be also referred to as a "lead frame".

The die paddle 10 has an upper surface 11, a lower surface 12 (FIG. 6) opposite to the upper surface 11 and a side surface 13 extending between the upper surface 11 and the lower surface 12. In some embodiments, the die paddle 10 may include an extending portion 15 protruding outward from the side surface 13.

Figure 6:
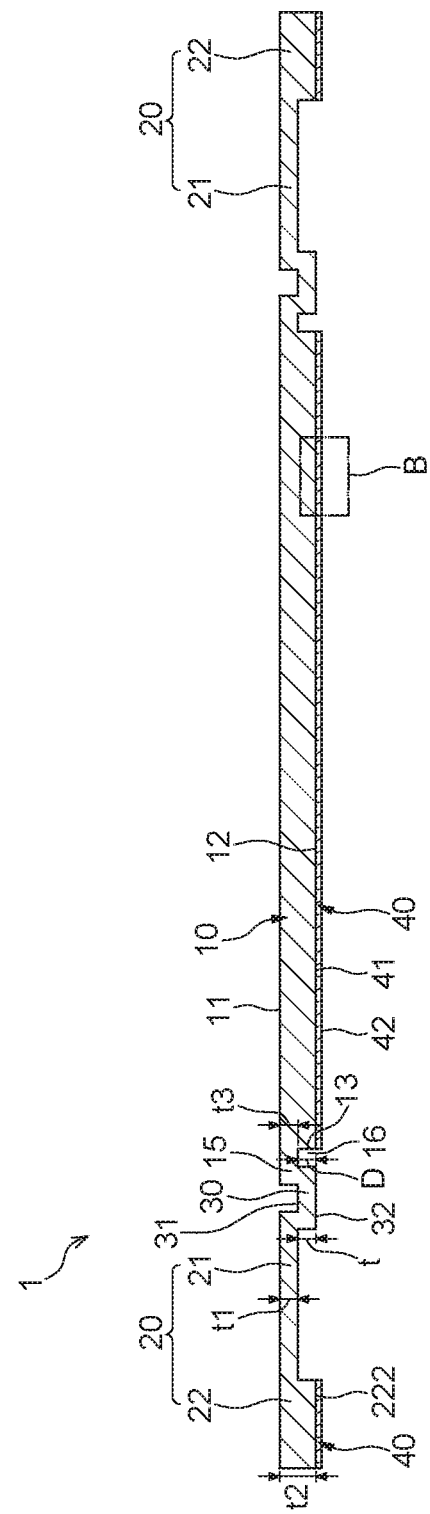
FIG. 6 illustrates a cross-sectional view along line A-A of FIG. 5.

FIG. 6 illustrates a cross-sectional view along line A-A of FIG. 5. Referring to FIG. 3, FIG. 4 and FIG. 6, the leads 20 surround the die paddle 10. Each of the leads 20 includes an inner lead portion 21 and an outer lead portion 22. The inner lead portion 21 is adjacent to and spaced apart from the die paddle 10. The inner lead portion 21 may be a place for receiving an end of a bonding wire. The outer lead portion 22 is opposite to the inner lead portion 21. In some embodiments, the inner lead portion 21 and the outer lead portion 22 are formed integrally (e.g. and concurrently) as a monolithic structure. That is, each of the leads 20 may be a monolithic structure.

The at least four corner leads 20' correspond to four corners of the die paddle 10 respectively. The at least four corner leads 20' may replace four tie bars used in comparative lead frames to increase a number of the leads of the lead frame 1.

The connector 30 is connected to the die paddle 10 and the inner lead portions 21 of the leads 20. Further, the connector 30 may contact a table of a wire bonding machine during a wire bonding process. In some embodiments, a spacer may be disposed between the connector 30 and the table of the wire bonding machine, thus there is no gap between the connector 30 and the table of the wire bonding machine. In some embodiments, the die paddle 10, the leads 20 and the connector 30 are formed integrally (e.g. and concurrently) as a monolithic structure, thus there is no gap or boundary between the inner lead portion 21 and the connector 30 to prevent the lead 20 from shaking or deforming during the wire bonding process. A material of the connector 30 is same as a material of the inner lead portion 21.

In some embodiments, the connector 30 may be connected to the extending portion 15 of the die paddle 10. Thus, the connector 30, the extending portion 15 and the side surface 13 of the die paddle 10 may define at least one cavity 16. In some embodiments, a depth D of the cavity 16 may be substantially equal to a thickness t of the connector 30 or a thickness t3 of the extending portion 15.

The connector 30 has an upper surface 31 and a lower surface 32 opposite to the upper surface 31. The upper surface 31 may be substantially coplanar with a bottom surface of the inner lead portion 21. The lower surface 32 may be substantially coplanar with the lower surface 12 of the die paddle 10.

To improve the structural strength of the lead 20 and allow the length of the lead 20 to be lengthened, the thickness t of the connector 30 may be substantially equal to a thickness t1 of the inner lead portion 21, and a sum of the thickness t of the connector 30 and the thickness t1 of the inner lead portion 21 may be substantially equal to a thickness t2 of the outer lead portion 22. Thus, the lower surface 32 of the connector 30 is substantially coplanar with a lower surface 222 of the outer lead portion 22.

In some embodiments, the connector 30 may include a plurality of connecting portions 33 and a plurality of bridge portions 34. The connecting portions 33 may be connected to the die paddle 10 and the inner lead portions 21. Each of the bridge portions 34 may be between two adjacent connecting portions 33. The connecting portions 33 may be connected to each other through the bridge portions 34 to form a support ring that surrounds the die paddle 10. In some embodiments, the support ring may be in a square shape, and the support ring has a uniform thickness that may be substantially equal to the thickness t1 of the inner lead portion 21.

In some embodiments, the bridge portions 34 of the connector 30 may be omitted. That is, the connecting portions 33 may be spaced apart from each other.

The connector 30 may improve the structural strength of the lead 20, thereby allowing the length of the lead 20 to be lengthened, for example, a length of the inner lead portion 21 may be lengthened to greater than about 3 mm, about 5 mm, or about 8 mm.

Figure 7:
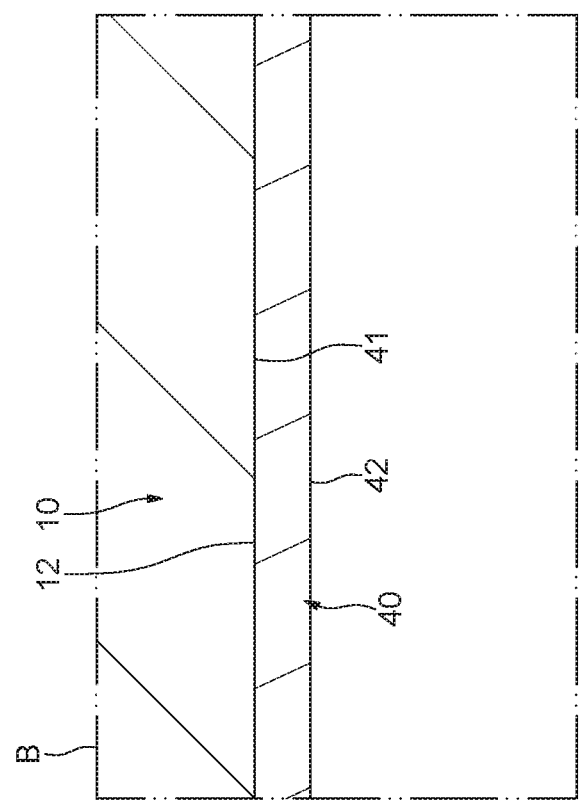
FIG. 7 illustrates an enlarged view of an area B of FIG. 6.

FIG. 7 illustrates an enlarged view of an area B of FIG. 6. Referring to FIG. 6 and FIG. 7, the bonding layer 40 is disposed on the lower surface 12 of the die paddle 10 and the lower surface 222 of each of the outer lead portions 22. In some embodiments, the bonding layer 40 may include at least one metal layer. The bonding layer 40 has an upper surface 41 and a lower surface 42 opposite to the upper surface 41. In some embodiments, the upper surface 41 may be substantially coplanar with the lower surface 12 of the die paddle 10 and the lower surface 32 of the connector 30. The lower surface 42 may protrude downward from the lower surface 32 of the connector 30. A material of the bonding layer 40 may be different from a material of the die paddle 10 and a material of the lead 20.

Figure 8:
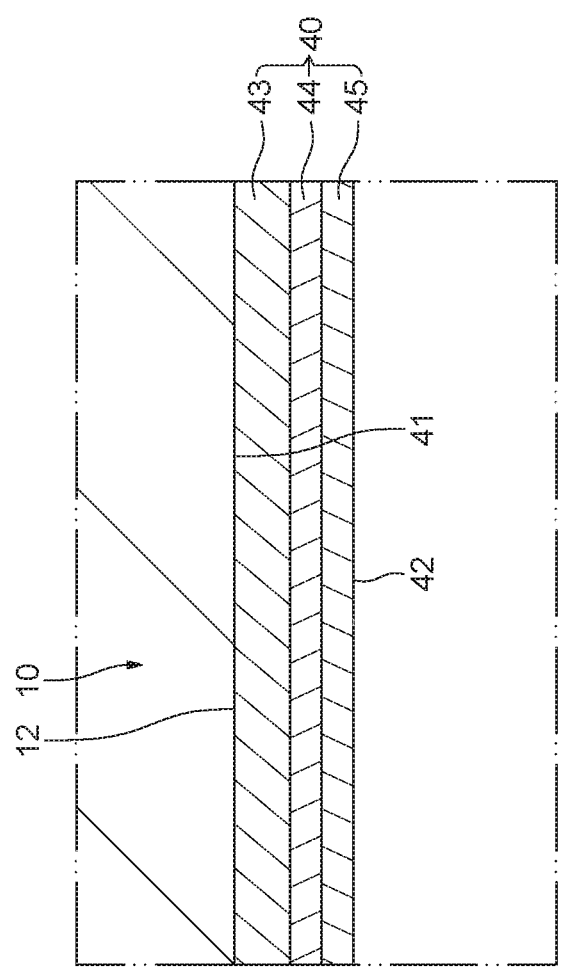
FIG. 8 illustrates a schematic view of a bonding layer according to some embodiments of the present disclosure.

FIG. 8 illustrates a schematic view of a bonding layer according to some embodiments of the present disclosure. In some embodiments, the bonding layer 40 may include a first metal layer 43, a second metal layer 44 and a third metal layer 45. The first metal layer 43 may be disposed on the lower surface 12 of the die paddle 10 and the lower surface 222 of each of the outer lead portions 22. The second metal layer 44 may be disposed on the first metal layer 43. The third metal layer 45 may be disposed on the second metal layer 44. In some embodiments, a material of the first metal layer 43, a material of the second metal layer 44 and a material of the third metal layer 45 may be substantially different from each other. For example, the material of the first metal layer 43 may be nickel (Ni), the material of the second metal layer 44 may be palladium (Pd), and the material of the third metal layer 45 may be gold (Au).

The bonding layer 40 may be directly bonded to a substrate (e.g., a printed circuit board), thus solder balls or solder bumps are not necessary to be used in the on-board process, thereby simplifying the manufacturing process and improving the board level reliability.

Figure 9:
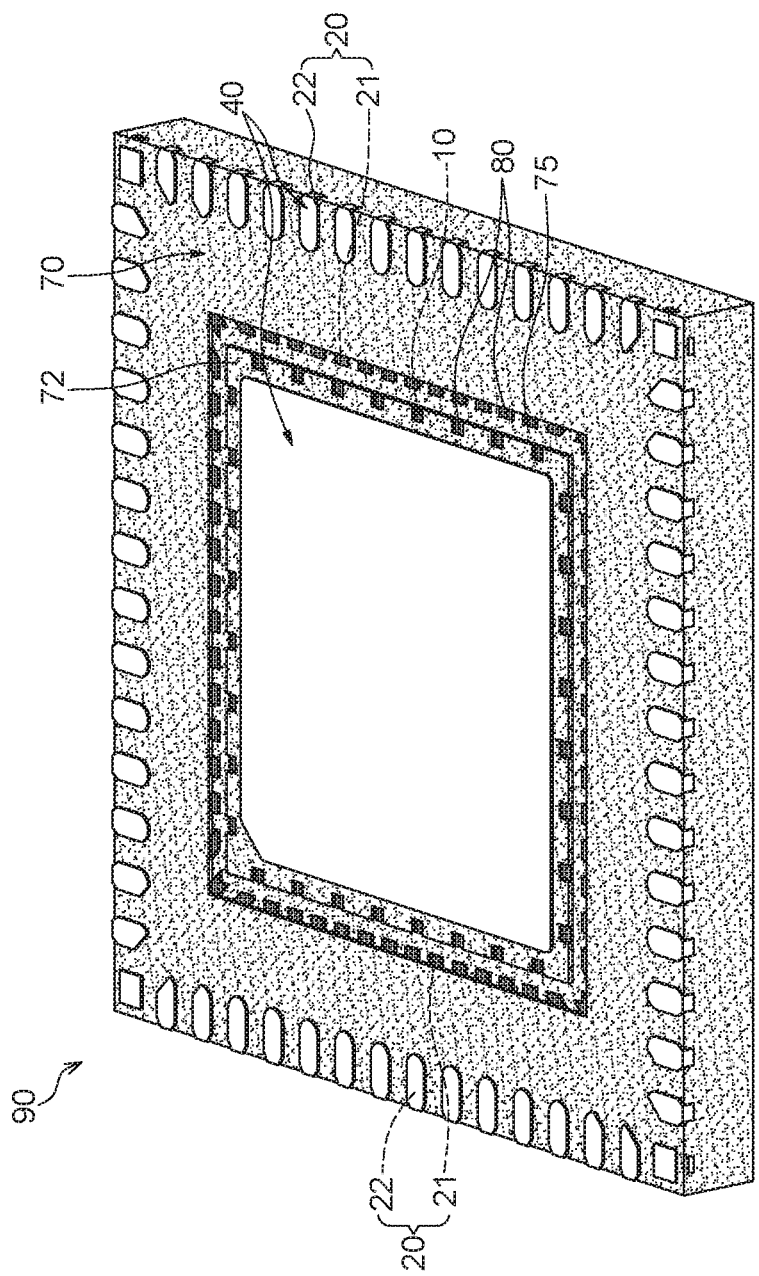
FIG. 9 illustrates a bottom perspective view of a package structure according to some embodiments of the present disclosure.
Figure 10:
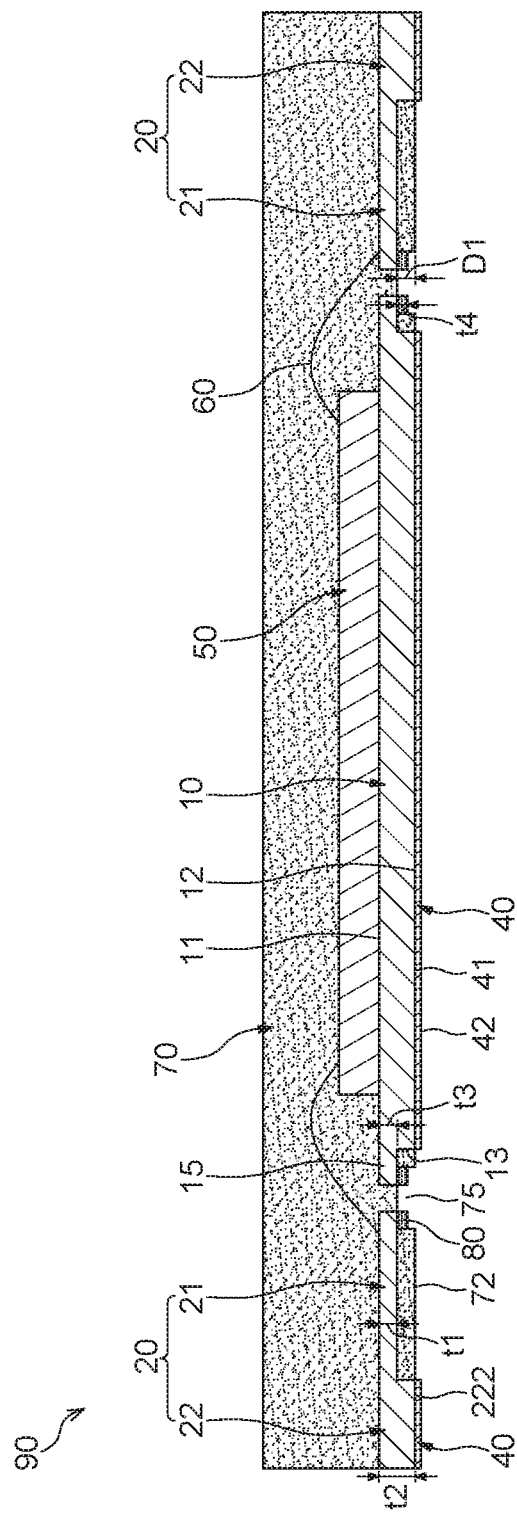
FIG. 10 illustrates a cross-sectional view of the package structure of FIG. 9.

FIG. 9 illustrates a bottom perspective view of a package structure 90 according to some embodiments of the present disclosure. FIG. 10 illustrates a cross-sectional view of the package structure of FIG. 9. The package structure 90 includes the lead frame 1 of FIG. 2 through FIG. 6, a semiconductor die 50 disposed on the die paddle 10 (e.g., the upper surface 11), a plurality of bonding wires 60 for electrically connecting the semiconductor die 50 and the inner lead portions 21, an encapsulant 70 and a coating 80.

The encapsulant 70 covers the semiconductor die 50, the die paddle 10, the bonding wires 60 and the leads 20, and defines at least one opening 75 on a bottom surface 72 thereof to expose a portion (e.g., the extending portion 15) of the die paddle 10 and a portion of each of the inner lead portions 21. In some embodiments, the bottom surface 72 of the encapsulant 70 may be substantially coplanar with the lower surface 12 of the die paddle 10 and the lower surface 222 of each of the outer lead portions 22.

In some embodiments, the at least one opening 75 of the encapsulant 70 is formed through removing the connector 30 of FIG. 3. Thus, the size and the position of the opening 75 are substantially equal to the size and the position of the connector 30. That is, the opening 75 may be a ring-shaped opening. In some embodiments, the ring-shaped opening is in a square shape.

The coating 80 is disposed in the at least one opening 75 of the encapsulant 70 to cover the exposed portion of the die paddle 10 and the exposed portion of each of the inner lead portions 21. The coating 80 may surround the die paddle 10. A thickness t4 of the coating 80 may be less than or equal to a depth D1 of the opening 75. In some embodiments, the coating 80 may be recessed from the bottom surface 72 of the encapsulant 70, and a material of the coating 80 may be different from a material of the encapsulant 70. The coating 80 may be a solder resist coating, and further the coating 80 may be a UV curable coating. The constituent of the coating 80 may include resin, colorant (in color of black or green), photoinitiator, additives (for example, antifoamer and leveling agent) and solvent. In addition, the material properties of the coating 80 may include a viscosity of about 15.0 mPa·s, a specific gravity of about 1.0 and a surface tension of about 24 to 26 mN/m.

As shown in FIG. 10, the coating 80 may contact the encapsulant 70, and a portion of the encapsulant 70 may be between the die paddle 10 (e.g., the extending portion 15) and the inner lead portions 21. Further, the opening 75 may expose the portion of the encapsulant 70.

FIG. 11 through FIG. 19 illustrate a method for manufacturing a lead frame according to some embodiments of the present disclosure. In some embodiments, the method is for manufacturing a lead frame such as the lead frame 9 shown in FIG. 1 through FIG. 5.

Figure 11:
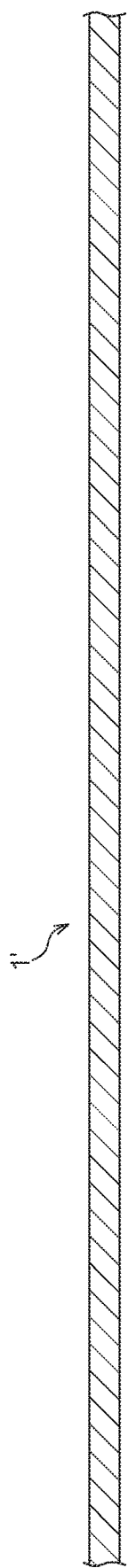
FIG. 11 illustrates one or more stages of an example of a method for manufacturing a lead frame according to some embodiments of the present disclosure.
Figure 12:
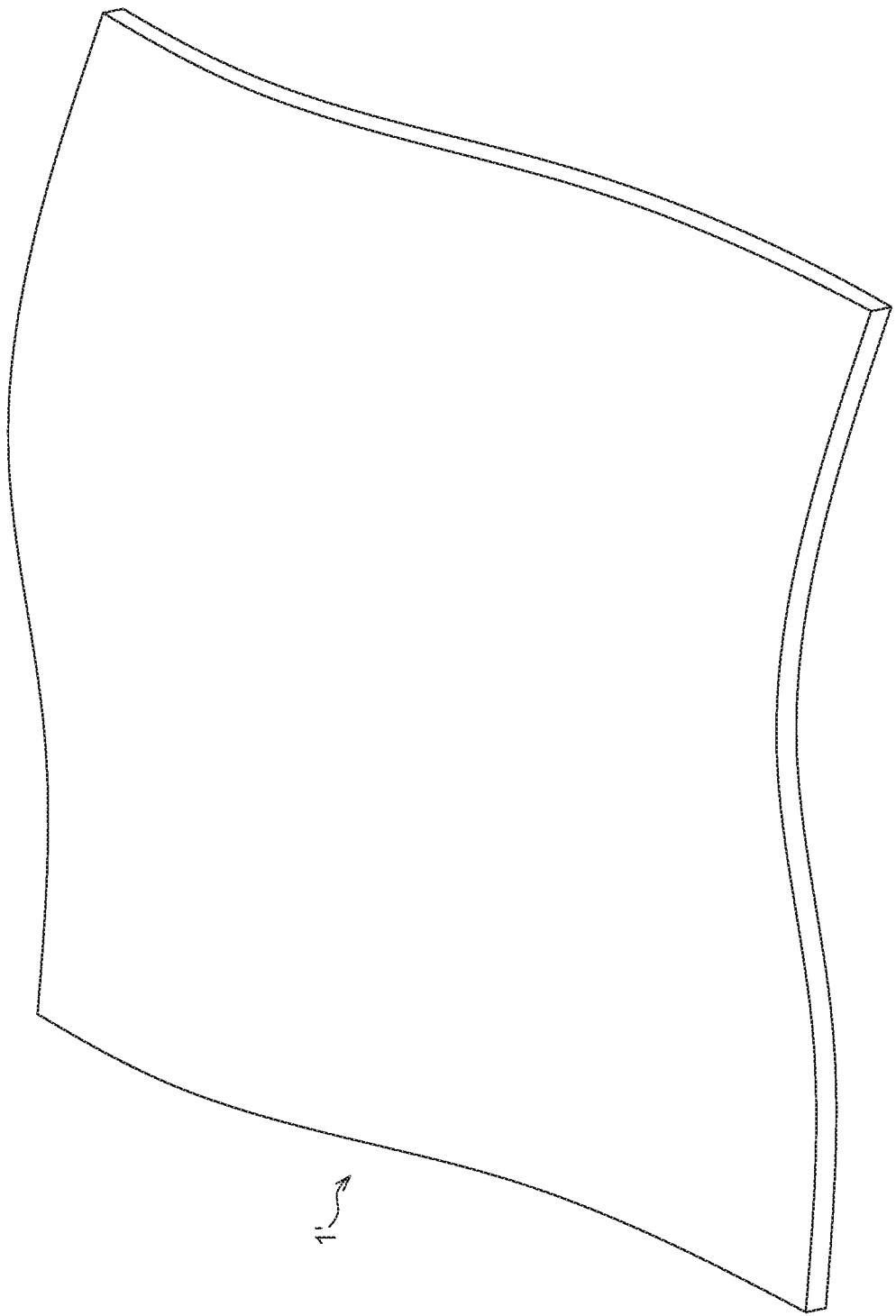
FIG. 12 illustrates one or more stages of an example of a method for manufacturing a lead frame according to some embodiments of the present disclosure.

Referring to FIG. 11 and FIG. 12, a metal plate 1' is provided. In some embodiments, the metal plate 1' may be a copper plate.

Figure 13:
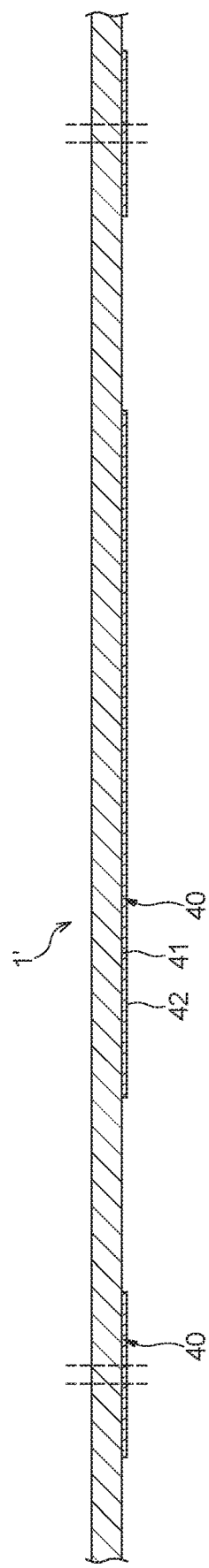
FIG. 13 illustrates one or more stages of an example of a method for manufacturing a lead frame according to some embodiments of the present disclosure.
Figure 14:
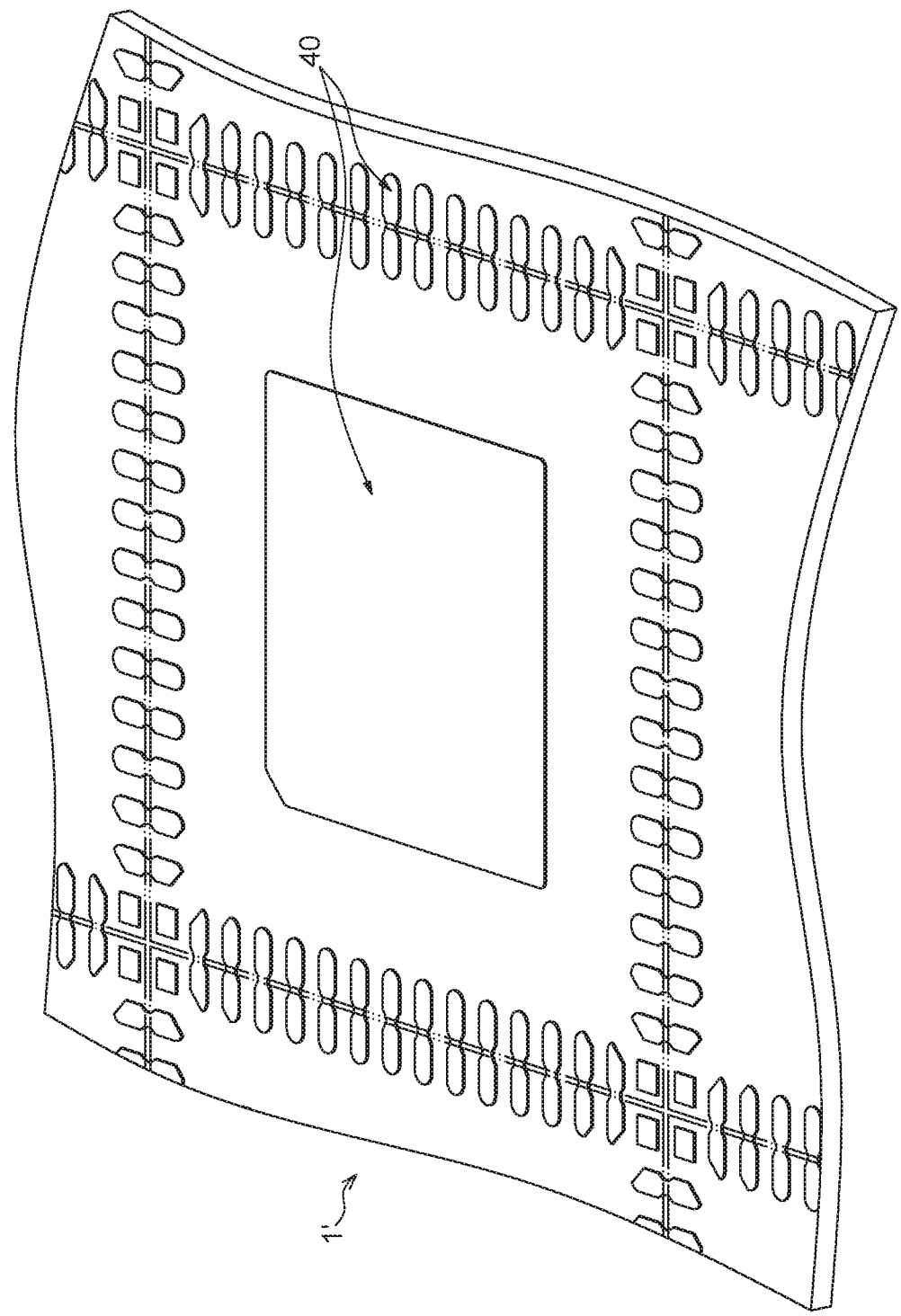
FIG. 14 illustrates one or more stages of an example of a method for manufacturing a lead frame according to some embodiments of the present disclosure.

Referring to FIG. 13 and FIG. 14, a bonding layer 40 is formed to cover a portion of the metal plate 1' and expose a portion of the metal plate 1' by, for example, plating. The bonding layer 40 may be an etching mask layer. In some embodiments, the bonding layer 40 may include at least one metal layer. The bonding layer 40 has an upper surface 41 and a lower surface 42 opposite to the upper surface 41. A material of the bonding layer 40 may be different from a material of the metal plate 1'.

Figure 15:
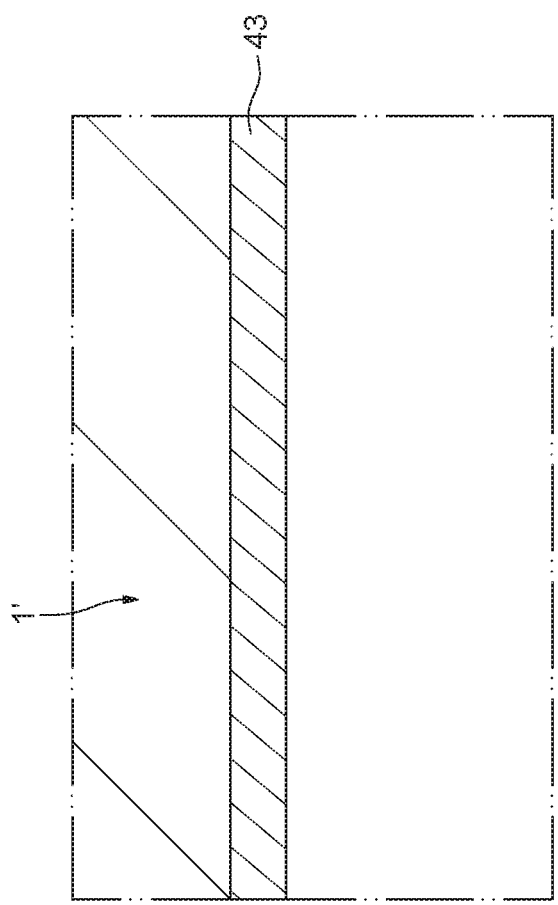
FIG. 15 illustrates one or more stages of an example of a method for manufacturing a lead frame according to some embodiments of the present disclosure.
Figure 16:
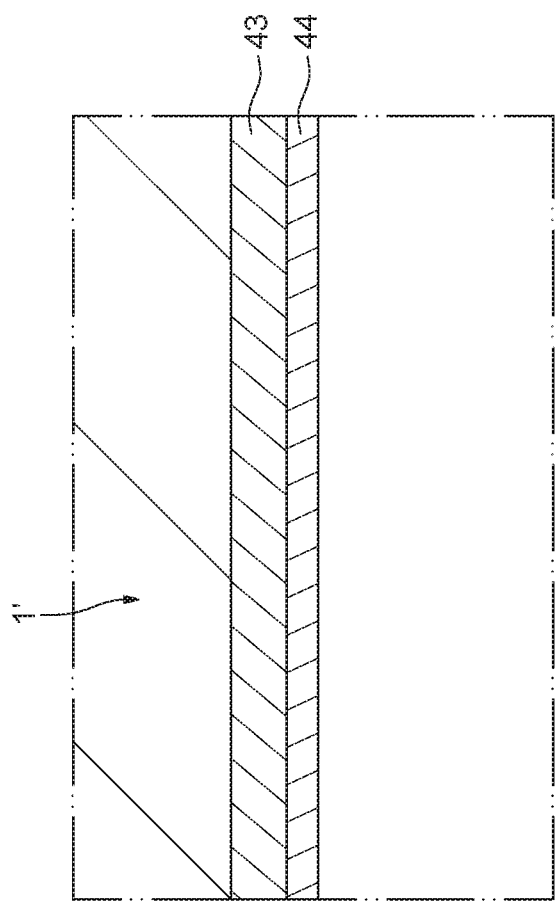
FIG. 16 illustrates one or more stages of an example of a method for manufacturing a lead frame according to some embodiments of the present disclosure.
Figure 17:
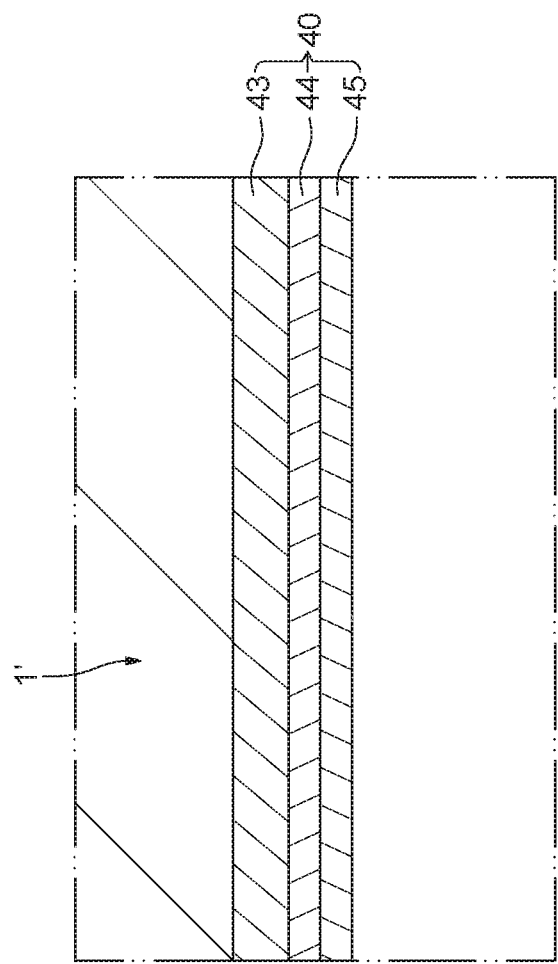
FIG. 17 illustrates one or more stages of an example of a method for manufacturing a package structure according to some embodiments of the present disclosure.

In some embodiments, as shown in FIG. 8, the bonding layer 40 may include a first metal layer 43, a second metal layer 44 and a third metal layer 45. Referring to FIG. 15, the first metal layer 43 may be formed on the metal plate 1' by, for example, plating. Referring to FIG. 16, the second metal layer 44 may be formed on the first metal layer 43 by, for example, plating. Referring to FIG. 17, the third metal layer 45 may be formed on the second metal layer 44 to constitute the bonding layer 40 by, for example, plating. In some embodiments, a material of the first metal layer 43, a material of the second metal layer 44 and a material of the third metal layer 45 may be substantially different from each other. For example, the material of the first metal layer 43 may be nickel (Ni), the material of the second metal layer 44 may be palladium (Pd), and the material of the third metal layer 45 may be gold (Au).

Figure 18:
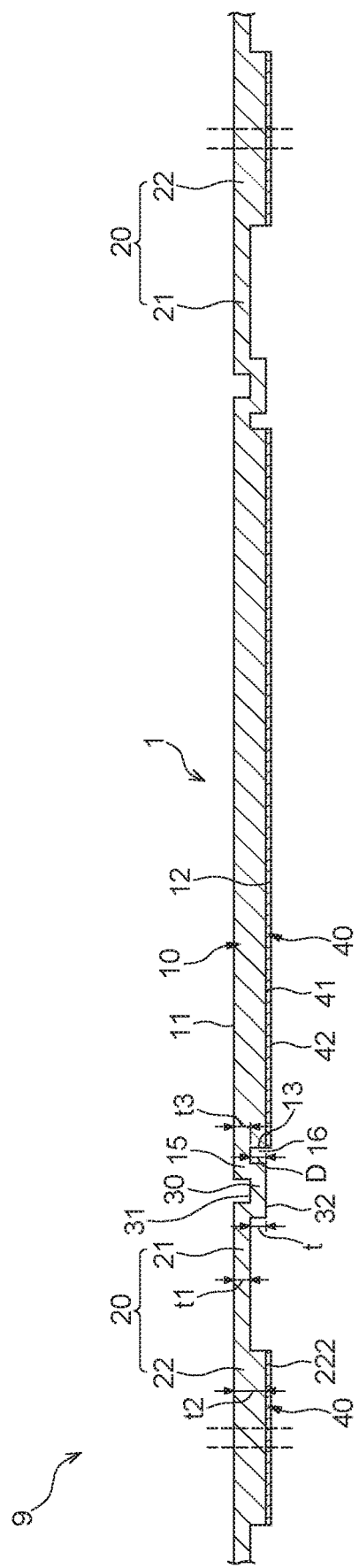
FIG. 18 illustrates one or more stages of an example of a method for manufacturing a package structure according to some embodiments of the present disclosure.
Figure 19:
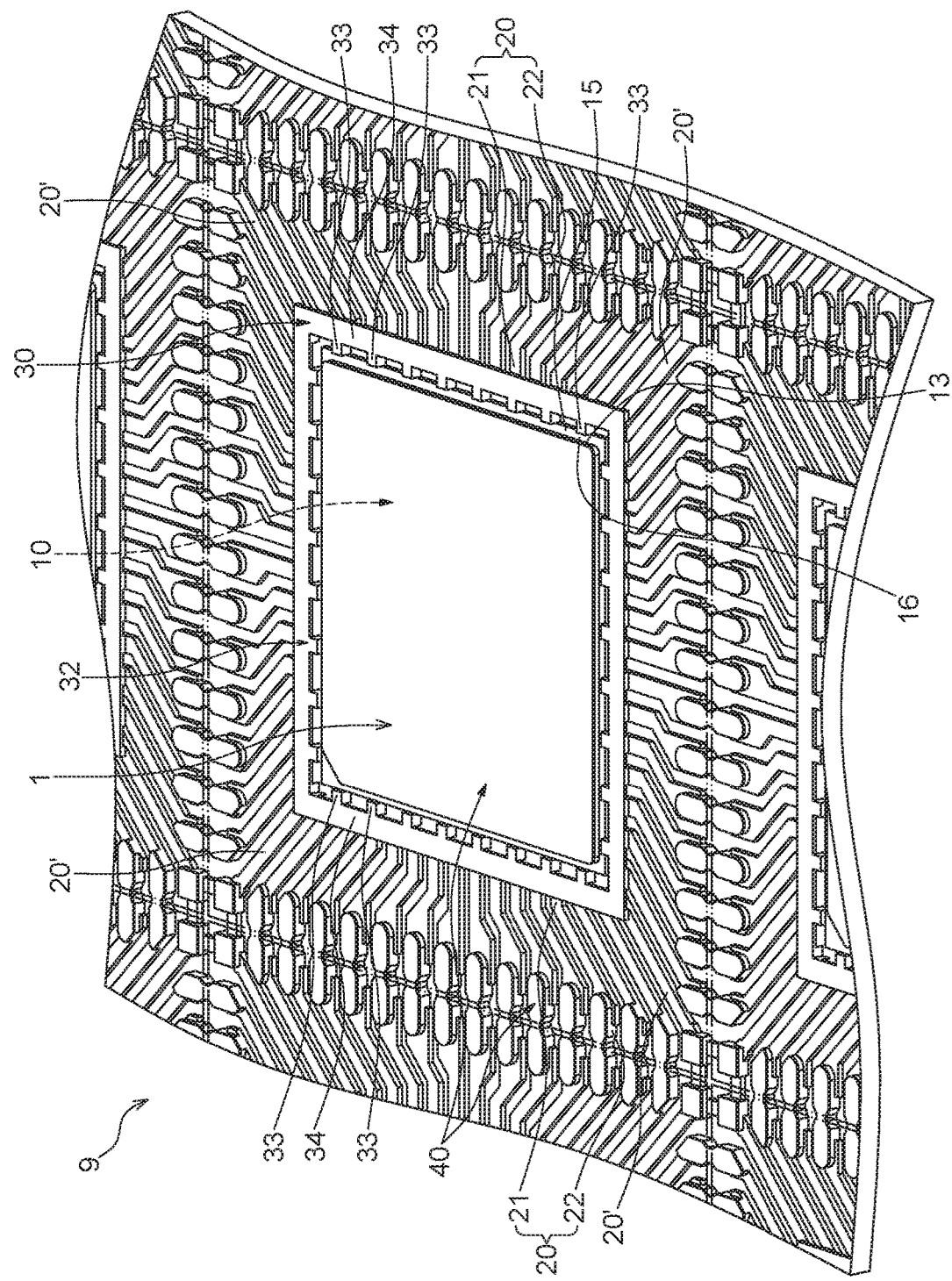
FIG. 19 illustrates one or more stages of an example of a method for manufacturing a package structure according to some embodiments of the present disclosure.

Referring to FIG. 13, FIG. 18 and FIG. 19, the exposed portion of the metal plate 1' is etched to form a lead frame 9 of FIG. 1 through FIG. 5. The lead frame 9 includes a plurality of lead frame units 1 arranged in an array. Each of the lead frame units 1 includes a die paddle 10, a plurality of leads 20, at least four corner leads 20', at least one connector 30 and the bonding layer 40. In some embodiments, the lead frame unit 1 may be also referred to as a "lead frame". In some embodiments, some portions (e.g., portions corresponding to a surface of the connector 30 and a surface of each of the leads 20) of the exposed portion of the metal plate 1' may be covered by the other etching mask layer before the etch process. Thus, the connector 30 and the leads 20 may be formed after the etch process.

The die paddle 10 has an upper surface 11, a lower surface 12 opposite to the upper surface 11 and a side surface 13 extending between the upper surface 11 and the lower surface 12. In some embodiments, the die paddle 10 may include an extending portion 15 protruding outward from the side surface 13.

The leads 20 surround the die paddle 10. Each of the leads 20 includes an inner lead portion 21 and an outer lead portion 22. The inner lead portion 21 is adjacent to and spaced apart from the die paddle 10. The inner lead portion 21 may be a place for receiving an end of a bonding wire. The outer lead portion 22 is opposite to the inner lead portion 21. In some embodiments, the inner lead portion 21 and the outer lead portion 22 are formed integrally (e.g. and concurrently) as a monolithic structure. That is, each of the leads 20 may be a monolithic structure. In some embodiments, the inner lead portions 21 and the connector 30 may be formed through a half-etch process.

The at least four corner leads 20' correspond to four corners of the die paddle 10 respectively. The at least four corner leads 20' may replace four tie bars used in comparative lead frames to increase a number of the leads of the lead frame 1.

The connector 30 is connected to the die paddle 10 and the inner lead portions 21 of the leads 20. Further, the connector 30 may contact a table of a wire bonding machine during a wire bonding process. In some embodiments, the die paddle 10, the leads 20 and the connector 30 are formed integrally (e.g. and concurrently) as a monolithic structure, thus there is no gap or boundary between the inner lead portion 21 and the connector 30 to prevent the lead 20 from shaking or deforming during the wire bonding process. A material of the connector 30 is same as a material of the inner lead portion 21.

In some embodiments, the connector 30 may be connected to the extending portion 15 of the die paddle 10. Thus, the connector 30, the extending portion 15 and the side surface 13 of the die paddle 10 may define at least one cavity 16. That is, the cavity 16 is formed between the die paddle 10 and the connector 30. In some embodiments, a depth D of the cavity 16 may be substantially equal to a thickness t of the connector 30 or a thickness t3 of the extending portion 15.

The connector 30 has an upper surface 31 and a lower surface 32 opposite to the upper surface 31. The upper surface 31 may be substantially coplanar with a bottom surface of the inner lead portion 21. The lower surface 32 may be substantially coplanar with the lower surface 12 of the die paddle 10.

To improve the structural strength of the lead 20 and allow the length of the lead 20 to be lengthened, the thickness t of the connector 30 may be substantially equal to a thickness t1 of the inner lead portion 21, and a sum of the thickness t of the connector 30 and the thickness t1 of the inner lead portion 21 may be substantially equal to a thickness t2 of the outer lead portion 22. Thus, the lower surface 32 of the connector 30 is substantially coplanar with a lower surface 222 of the outer lead portion 22.

In some embodiments, the connector 30 may include a plurality of connecting portions 33 and a plurality of bridge portions 34. The connecting portions 33 may be connected to the die paddle 10 and the inner lead portions 21. Each of the bridge portions 34 may be between two adjacent connecting portions 33. The connecting portions 33 may be connected to each other through the bridge portions 34 to form a support ring that surrounds the die paddle 10. In some embodiments, the support ring may be in a square shape, and the support ring has a uniform thickness that may be substantially equal to the thickness t1 of the inner lead portion 21.

In some embodiments, the bridge portions 34 of the connector 30 may be omitted. That is, the connecting portions 33 may be spaced apart from each other.

The bonding layer 40 is formed on the lower surface 12 of the die paddle 10 and the lower surface 222 of each of the outer lead portions 22. In some embodiments, the upper surface 41 of the bonding layer 40 may be substantially coplanar with the lower surface 12 of the die paddle 10 and the lower surface 32 of the connector 30. The lower surface 42 of the bonding layer 40 may protrude downward from the lower surface 32 of the connector 30.

Figure 20:
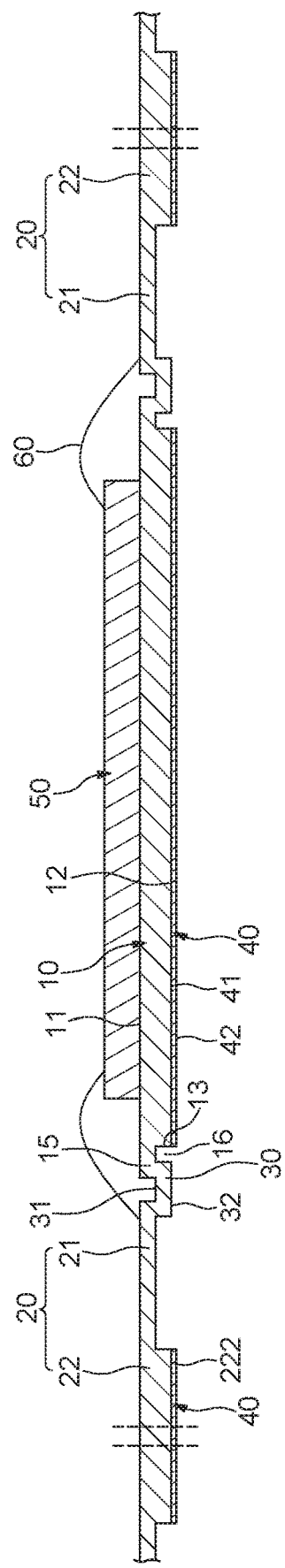
FIG. 20 illustrates one or more stages of an example of a method for manufacturing a package structure according to some embodiments of the present disclosure.
Figure 21:
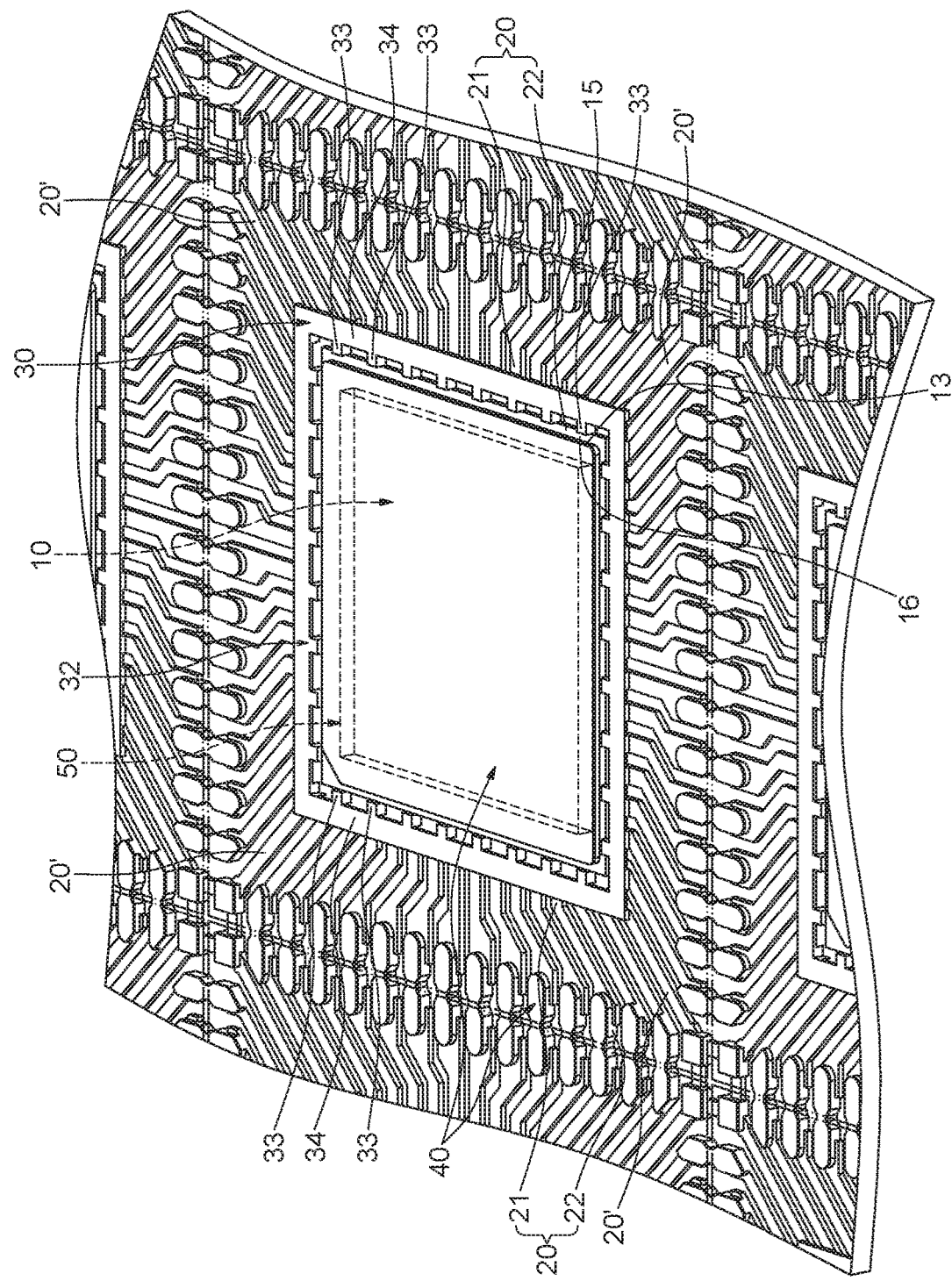
FIG. 21 illustrates one or more stages of an example of a method for manufacturing a package structure according to some embodiments of the present disclosure.

FIG. 20 through FIG. 28 illustrate a method for manufacturing a package structure according to some embodiments of the present disclosure. In some embodiments, the method is for manufacturing a package structure such as the package structure 90 shown in FIG. 9. The initial several stages of the illustrated process are the same as, or similar to, the stages illustrated in FIG. 11 through FIG. 19 for manufacturing the lead frame 9 of FIG. 1 through FIG. 5. FIG. 20 and FIG. 21 depict a stage subsequent to that depicted in FIG. 19.

Referring to FIG. 20 and FIG. 21, a semiconductor die 50 is disposed on the die paddle 10, and a plurality of bonding wires 60 electrically connect the semiconductor die 50 and the inner lead portions 21. During the wire bonding process, the connector 30 may contact the table of the wire bonding machine and support the inner lead portions 21 of the leads 20, thereby preventing the inner lead portions 21 from shaking or deforming during the wire bonding process. Accordingly, the inner lead portions 21 may be further lengthened to more than the comparative inner leads.

Figure 22:
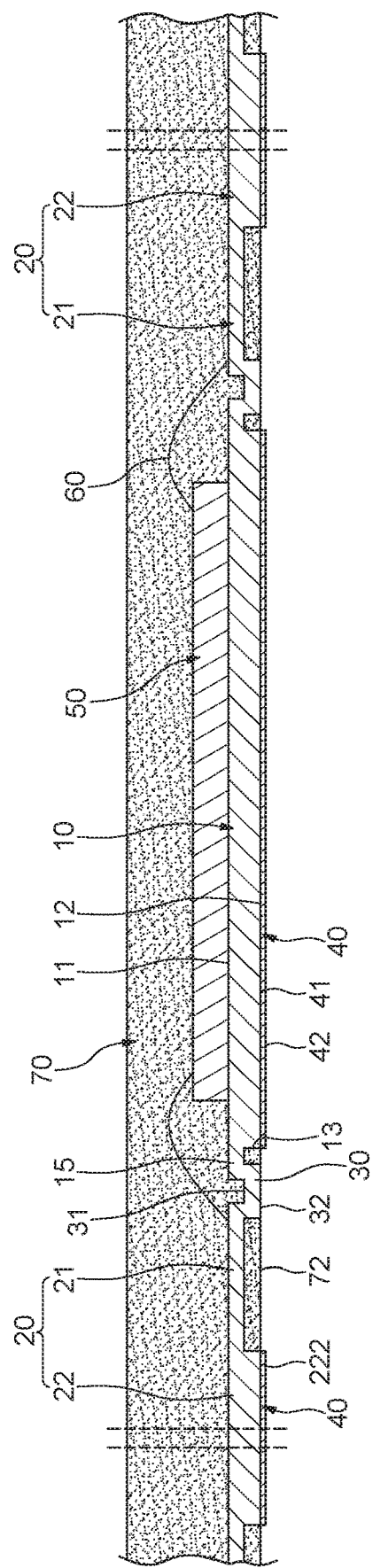
FIG. 22 illustrates one or more stages of an example of a method for manufacturing a package structure according to some embodiments of the present disclosure.
Figure 23:
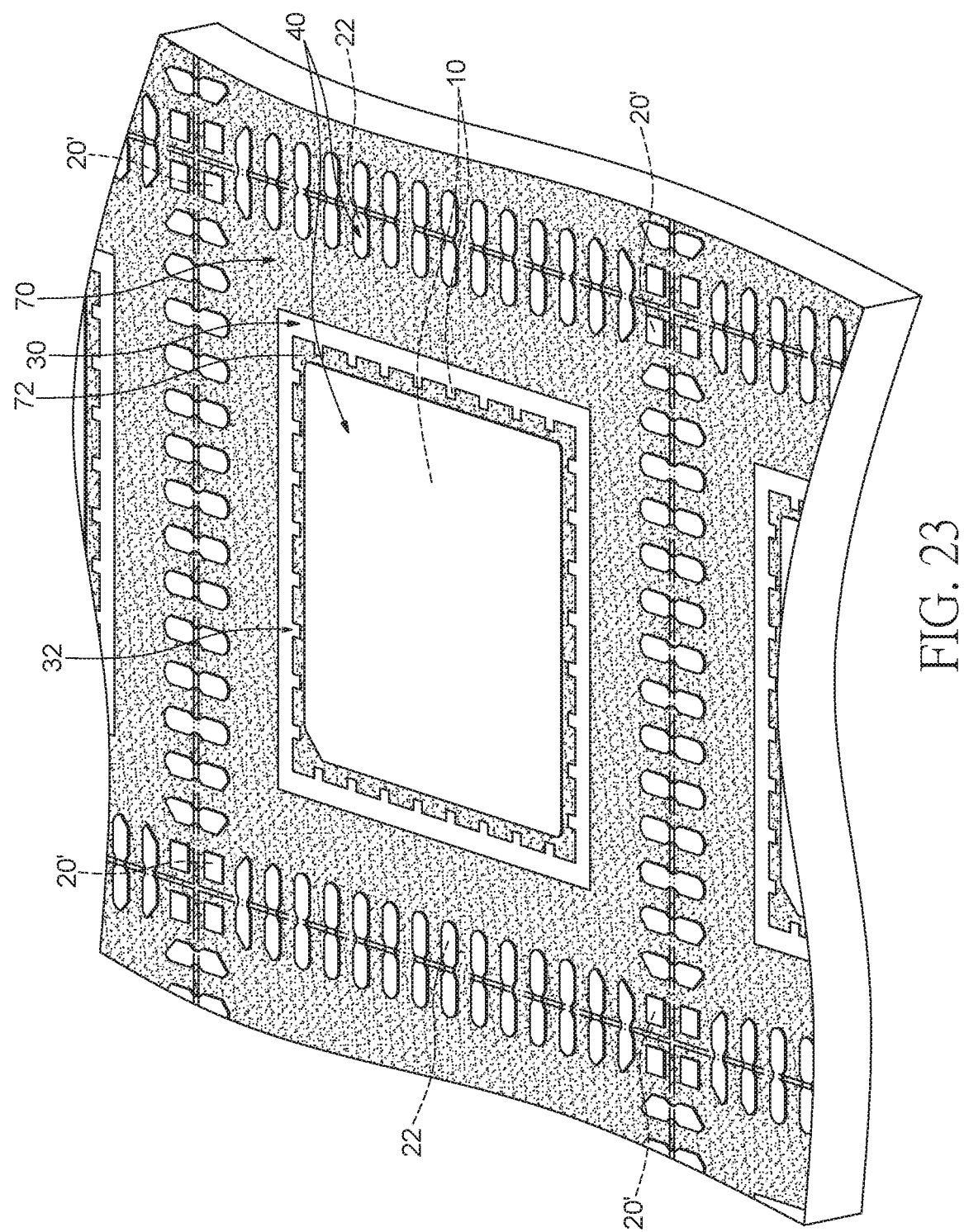
FIG. 23 illustrates one or more stages of an example of a method for manufacturing a package structure according to some embodiments of the present disclosure.

Referring to FIG. 22 and FIG. 23, an encapsulant 70 is formed to cover the semiconductor die 50, the die paddle 10, the bonding wires 60, the leads 20 and the connector 30, and exposes the lower surface 32 of the connector 30. In some embodiments, a bottom surface 72 of the encapsulant 70 may be substantially coplanar with the lower surface 32 of the connector 30.

Figure 24:
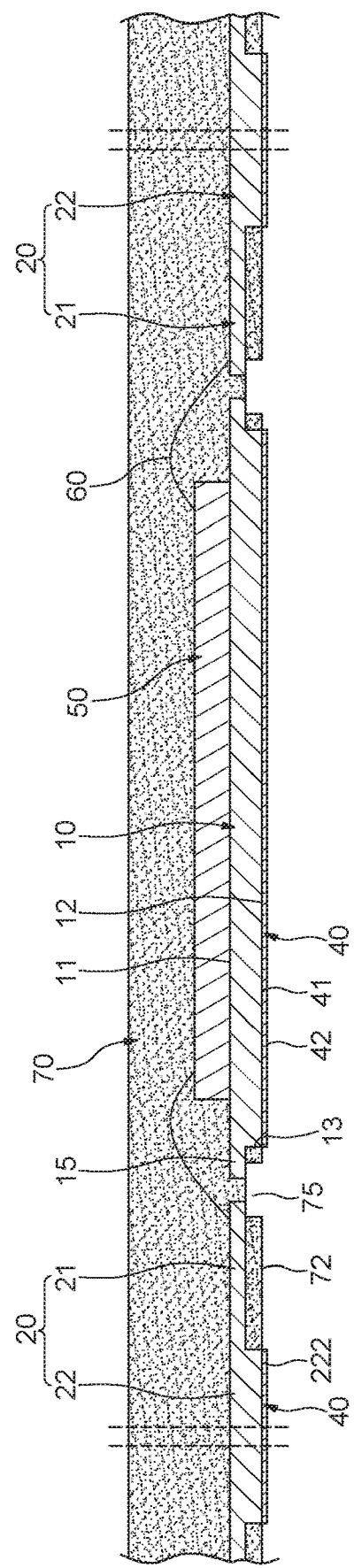
FIG. 24 illustrates one or more stages of an example of a method for manufacturing a package structure according to some embodiments of the present disclosure.
Figure 25:
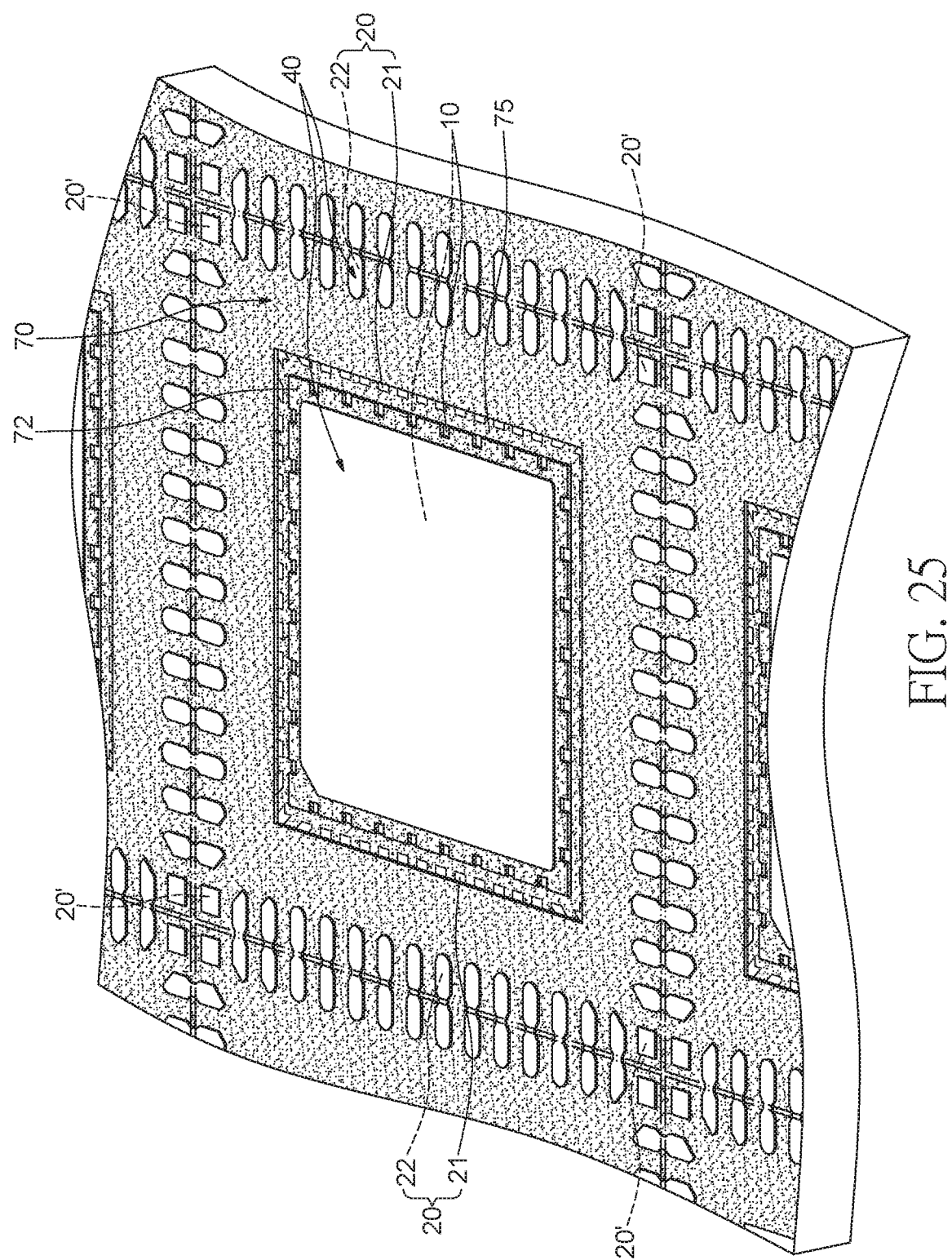
FIG. 25 illustrates one or more stages of an example of a method for manufacturing a package structure according to some embodiments of the present disclosure.

Referring to FIG. 22, FIG. 24 and FIG. 25, the connector 30 is removed to form at least one opening 75 on the bottom surface 72 of the encapsulant 70 and to expose a portion (e.g., the extending portion 15) of the die paddle 10 and a portion of each of the inner lead portions 21. In some embodiments, the connector 30 may be removed through an etch process.

Figure 26:
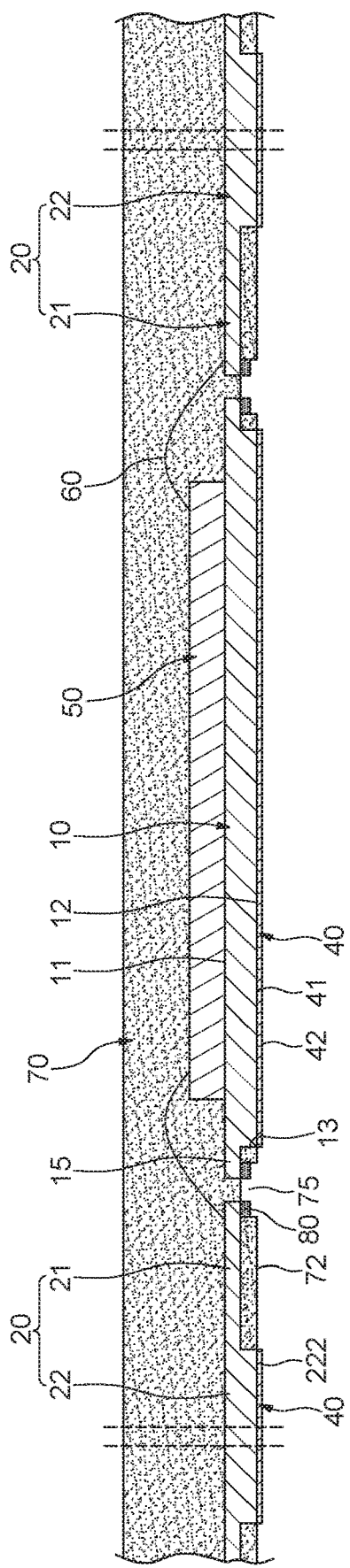
FIG. 26 illustrates one or more stages of an example of a method for manufacturing a package structure according to some embodiments of the present disclosure.
Figure 27:
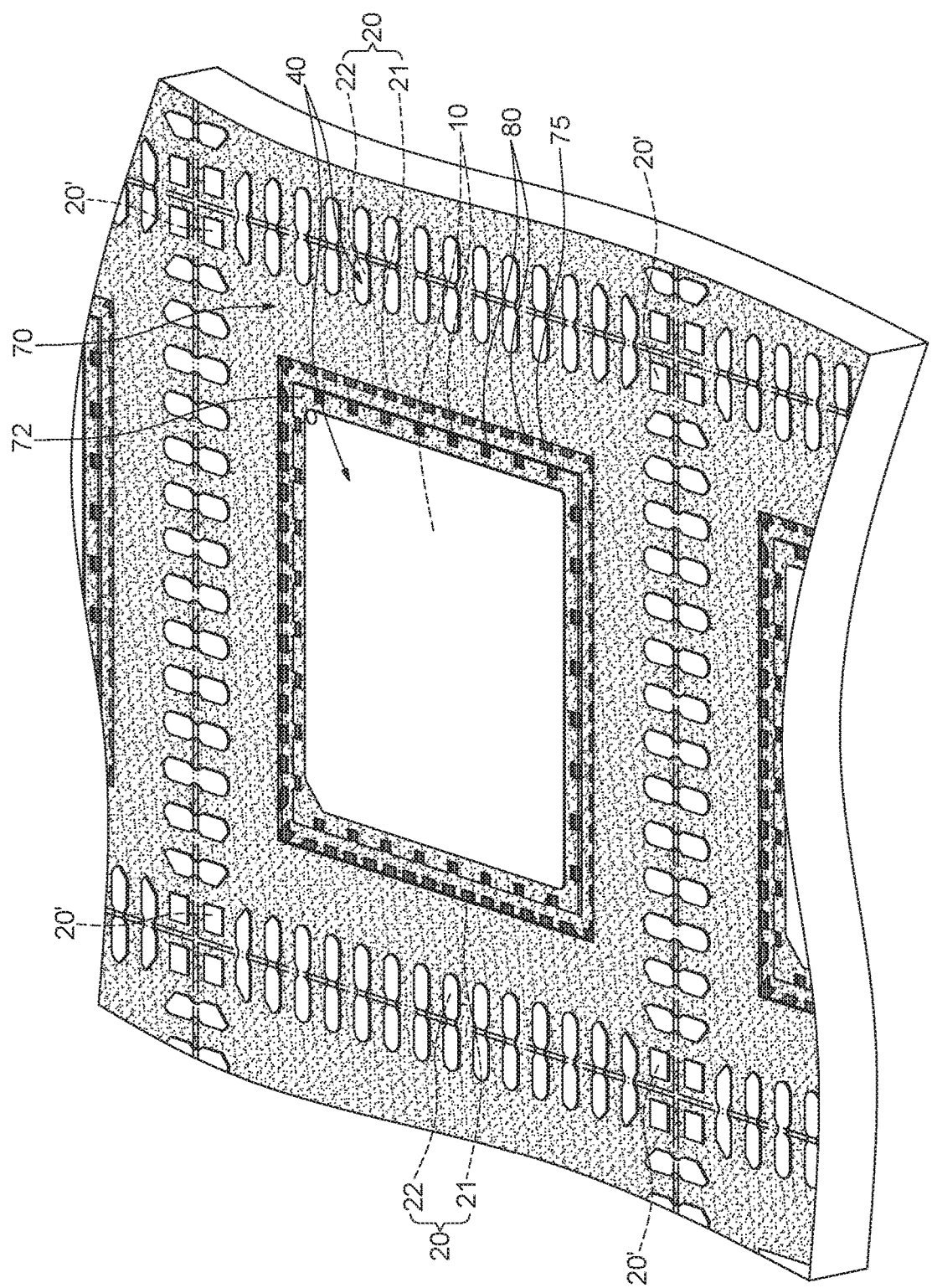
FIG. 27 illustrates one or more stages of an example of a method for manufacturing a package structure according to some embodiments of the present disclosure.
Figure 28:
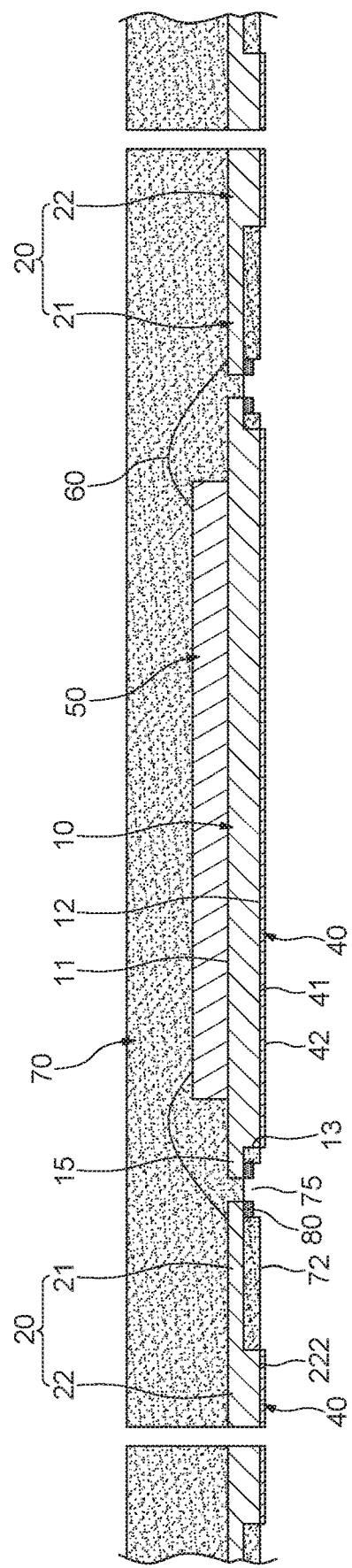
FIG. 28 illustrates one or more stages of an example of a method for manufacturing a package structure according to some embodiments of the present disclosure.

Referring to FIG. 26 and FIG. 27, a coating 80 is formed in the least one opening 75 to cover the exposed portion (e.g., the extending portion 15) of the die paddle 10 and the exposed portion of each of the inner lead portions 21. In some embodiments, the coating 80 may be recessed from the bottom surface 72 of the encapsulant 70, and a material of the coating 80 may be different from a material of the encapsulant 70. The coating 80 may be a solder resist coating, and further the coating 80 may be a UV curable coating. As shown in FIG. 28, the coating 80 may contact the encapsulant 70, and a portion of the encapsulant 70 may be between the die paddle 10 (e.g., the extending portion 15)

and the inner lead portions 21. Further, the opening 75 may expose the portion of the encapsulant 70.

Referring to FIG. 28, a singulation process is conducted to obtain a plurality of package structures 90 of FIG. 9.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A lead frame, comprising:
a die paddle;
a plurality of leads arranged around the die paddle, each of the plurality of leads including an inner lead portion adjacent to and spaced apart from the die paddle and an outer lead portion opposite to the inner lead portion; and
at least one connector connected to the die paddle and the inner lead portions of the plurality of leads,
wherein the connector includes a plurality of connecting portions connected to the die paddle and the inner lead portions and a plurality of bridge portions, each of the plurality of bridge portions is between and connects two adjacent connecting portions; and
wherein the die paddle includes an extending portion extending from one side thereof that is adjacent to the plurality of connecting portions, a lower surface of the extending portion is recessed from a lower surface of the die paddle, and the plurality of connecting portions physically contact the extending portion; the two adjacent connecting portions, the bridge portion between the two adjacent connecting portions and the extending portion of the die paddle collectively define a through hole extending through the one connector, and the through hole is located between the die paddle and the bridge portion; a lower surface of the connecting portion is substantially level with a lower surface of the bridge portion and the lower surface of the die paddle, and a lateral surface of the die paddle, the lower surface of the extending portion and a lateral surface of the connecting portion define a cavity.

2. The lead frame of claim 1, wherein the bridge portion is disposed between the connecting portion and the inner lead portion.

3. The lead frame of claim 1, further comprising a bonding layer disposed on a lower surface of the die paddle and a lower surface of each of the outer lead portions.

4. A package structure, comprising:
a die paddle;
a plurality of leads arranged around the die paddle; and
an encapsulant;
wherein portions of the die paddle covered by a coating are uncovered by a bonding layer, portions of the leads covered by the coating are uncovered by the bonding layer, the coating is uncovered by the encapsulant, the coating includes a first portion and a second portion, the first portion of the coating contacts the die paddle and the encapsulant, the second portion of the coating contacts an inner lead portion of the lead and the encapsulant, the encapsulant includes a first portion and a second portion, a lower surface of the first portion of the encapsulant is recessed from a lower surface of the bonding layer, a lower surface of the coating is recessed from the lower surface of the first portion of the encapsulant, and a lower surface of the second portion of the encapsulant is recessed from the lower surface of the coating.

5. The package structure of claim 4, wherein a thickness of the coating is less than a thickness of the encapsulant.

6. The package structure of claim 4, wherein the die paddle includes an extending portion extending from one side thereof that is adjacent to the inner lead portion, and the second portion of the encapsulant is disposed between and physically contacts the extending portion and the inner lead portion.

7. The package structure of claim 6, wherein the lower surface of the second portion of the encapsulant is substantially level with a lower surface of the extending portion and a lower surface of the inner lead portion.

8. The package structure of claim 7, further comprising a die disposed on an upper surface of the die paddle and a plurality of bonding wires for electrically connecting the die and the inner lead portions, wherein the second portion of the encapsulant encapsulates the die and the bonding wires.

9. The package structure of claim 5, wherein a material of the coating is different from a material of the bonding layer.

10. The package structure of claim 9, wherein the coating is a solder resist coating.

* * * * *